United States Patent
Jin et al.

(10) Patent No.: US 12,469,822 B2
(45) Date of Patent: Nov. 11, 2025

(54) SEMICONDUCTOR PACKAGE

(71) Applicant: Samsung Electronics Co., Ltd., Suwon-si (KR)

(72) Inventors: Hwail Jin, Seongnam-si (KR); Ji-Han Ko, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 609 days.

(21) Appl. No.: 17/841,184

(22) Filed: Jun. 15, 2022

(65) Prior Publication Data

US 2023/0109292 A1  Apr. 6, 2023

(30) Foreign Application Priority Data

Oct. 5, 2021 (KR) .................. 10-2021-0131682

(51) Int. Cl.
| | |
|---|---|
| *H01L 25/065* | (2023.01) |
| *H01L 21/02* | (2006.01) |
| *H01L 23/00* | (2006.01) |

(52) U.S. Cl.
CPC .... *H01L 25/0657* (2013.01); *H01L 21/02118* (2013.01); *H01L 24/16* (2013.01); *H01L 24/29* (2013.01); *H01L 24/32* (2013.01); *H01L 24/73* (2013.01); *H01L 2224/16225* (2013.01); *H01L 2224/29693* (2013.01);
(Continued)

(58) Field of Classification Search
CPC ........... H01L 25/0657; H01L 21/02118; H01L 24/16; H01L 24/29; H01L 24/32; H01L 2224/16225; H01L 2224/73; H01L 2224/73103; H01L 2224/73204; H01L 24/81

See application file for complete search history.

(56) References Cited

U.S. PATENT DOCUMENTS

| | | |
|---|---|---|
| 6,841,883 B1 | 1/2005 | Farnworth et al. |
| 10,076,801 B2 | 9/2018 | Song et al. |
| 10,128,348 B2 | 11/2018 | Lin |
(Continued)

FOREIGN PATENT DOCUMENTS

| | | | |
|---|---|---|---|
| JP | H08-288291 A | 11/1996 | |
| JP | 6812919 B2 | 1/2021 | |
(Continued)

*Primary Examiner* — Marlon T Fletcher
*Assistant Examiner* — Da Wei Lee
(74) *Attorney, Agent, or Firm* — Harness, Dickey & Pierce, P.L.C.

(57) ABSTRACT

A semiconductor package includes a lower semiconductor chip and semiconductor chips in a stack on the lower semiconductor chip in a first direction perpendicular to a top surface of the lower semiconductor chip. Connection bumps are between the lower semiconductor chip and a bottommost one of the semiconductor chips and between the semiconductor chips. A protection layer covers a lateral surface of each of the connection bumps. A mold layer is on the lower semiconductor chip and covering lateral surfaces of the semiconductor chips. The mold layer extends between the bottommost one of the semiconductor chips and the lower semiconductor chip and between the semiconductor chips. The protection layer is between the mold layer and the lateral surface of each of the connection bumps.

14 Claims, 12 Drawing Sheets

(52) U.S. Cl.
CPC .................... *H01L 2224/73* (2013.01); *H01L 2224/73103* (2013.01); *H01L 2224/73204* (2013.01)

(56) References Cited

U.S. PATENT DOCUMENTS

| | | |
|---|---|---|
| 11,676,923 B2 | 6/2023 | Park et al. |
| 2011/0298123 A1* | 12/2011 | Hwang .................. H01L 24/05 257/737 |
| 2013/0234317 A1 | 9/2013 | Chen et al. |
| 2014/0327133 A1* | 11/2014 | Lin ........................ H01L 24/11 257/737 |
| 2017/0358534 A1* | 12/2017 | Kim .................... H01L 23/3114 |
| 2019/0229082 A1* | 7/2019 | Nad ..................... H05K 3/4673 |
| 2021/0104483 A1* | 4/2021 | Park ....................... H01L 24/92 |

FOREIGN PATENT DOCUMENTS

| | | |
|---|---|---|
| KR | 10-2001-0037611 A | 5/2001 |
| KR | 2014-0131884 A | 11/2014 |
| KR | 101607675 B1 | 4/2016 |
| KR | 2017-0138906 A | 12/2017 |
| KR | 2021-0042212 A | 4/2021 |

\* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0131682 filed on Oct. 5, 2021 in the Korean Intellectual Property Office, the disclosure of which is hereby incorporated by reference in its entirety.

BACKGROUND

The present inventive concepts relate to a semiconductor package and/or a method of fabricating the same, and more particularly, to a semiconductor package in which a plurality of semiconductor chips are mounted and/or a method of fabricating the same.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With the development of the electronics industry, there is a demand for smaller, lighter, and multifunctional electronic devices, and therefore there is suggested a multi-chip package in which a plurality of chips are stacked in a single semiconductor package or a system-in-package which has different kinds of chips mounted in a single semiconductor package and which operates as one system.

SUMMARY

Some example embodiments of the present inventive concepts provide a semiconductor package with improved electrical properties and/or a method of fabricating the same.

Some example embodiments of the present inventive concepts provide a semiconductor package with improved thermal radiation properties and/or a simplified method of fabricating the same.

According to some example embodiments of the present inventive concepts, a semiconductor package may comprise: a lower semiconductor chip; a plurality of semiconductor chips in a stack on the lower semiconductor chip in a first direction perpendicular to a top surface of the lower semiconductor chip; a plurality of connection bumps between the lower semiconductor chip and a bottommost one of the plurality of semiconductor chips and the plurality of connection bumps being between the plurality of semiconductor chips; a protection layer that covers a lateral surface of each of the plurality of connection bumps; and a mold layer on the lower semiconductor chip, the mold layer covering lateral surfaces of the plurality of semiconductor chips. The mold layer may extend between the bottommost one of the plurality of semiconductor chips and the lower semiconductor chip and the mold layer extends between the plurality of semiconductor chips. The protection layer may be between the mold layer and the lateral surface of each of the plurality of connection bumps.

According to some example embodiments of the present inventive concepts, a semiconductor package may comprise: a lower semiconductor chip; a plurality of semiconductor chips in a stack on the lower semiconductor chip in a first direction perpendicular to a top surface of the lower semiconductor chip; a plurality of connection bumps between the lower semiconductor chip and a bottommost one of the plurality of semiconductor chips and the plurality of connection bumps being between the plurality of semiconductor chips; a protection layer that covers a lateral surface of each of the plurality of connection bumps; a mold layer that covers lateral surfaces of the plurality of semiconductor chips and extends between the bottommost one of the plurality of semiconductor chips and the lower semiconductor chip and between the plurality of semiconductor chips; and the mold layer defining at least one void between the bottommost one of the plurality of semiconductor chips and the lower semiconductor chip or between the plurality of semiconductor chips. The at least one void may expose at least a portion of the protection layer.

According to some example embodiments of the present inventive concepts, a semiconductor package may comprise: a lower semiconductor chip; a plurality of semiconductor chips in a stack on the lower semiconductor chip in a first direction perpendicular to a top surface of the lower semiconductor chip, each of the plurality of semiconductor chips including a plurality of chip through electrodes that penetrate therethrough; a plurality of connection bumps between the plurality of semiconductor chips; a protection layer that covers a lateral surface of each of the plurality of connection bumps; and a mold layer that covers the plurality of semiconductor chips and extends between the plurality of semiconductor chips. The chip through electrodes may be connected to corresponding ones among the plurality of connection bumps. The protection layer may be between the mold layer and the lateral surface of each of the plurality of connection bumps.

BRIEF DESCRIPTION OF THE DRAWINGS

The drawings described herein are for illustrative purposes only of selected embodiments and not all possible implementations, and are not intended to limit the scope of the present disclosure.

DETAIL PARTED DESCRIPTION OF EMBODIMENTS

The following will now describe in detail some example embodiments of the present inventive concepts with reference to the accompanying drawings.

Figure 1:
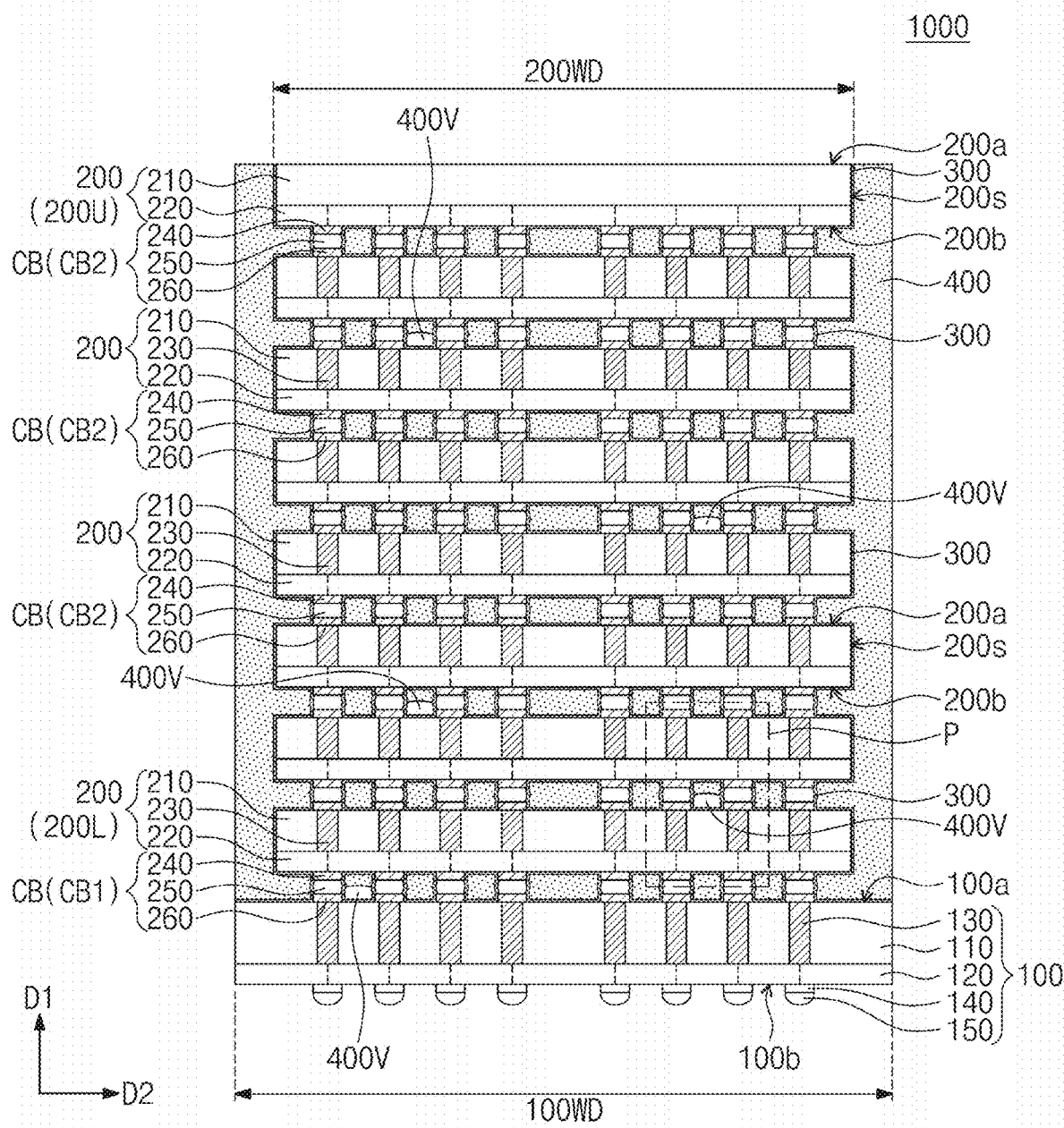
FIG. 1 illustrates a cross-sectional view showing a semiconductor package according to some example embodiments of the present inventive concepts.
Figure 2:
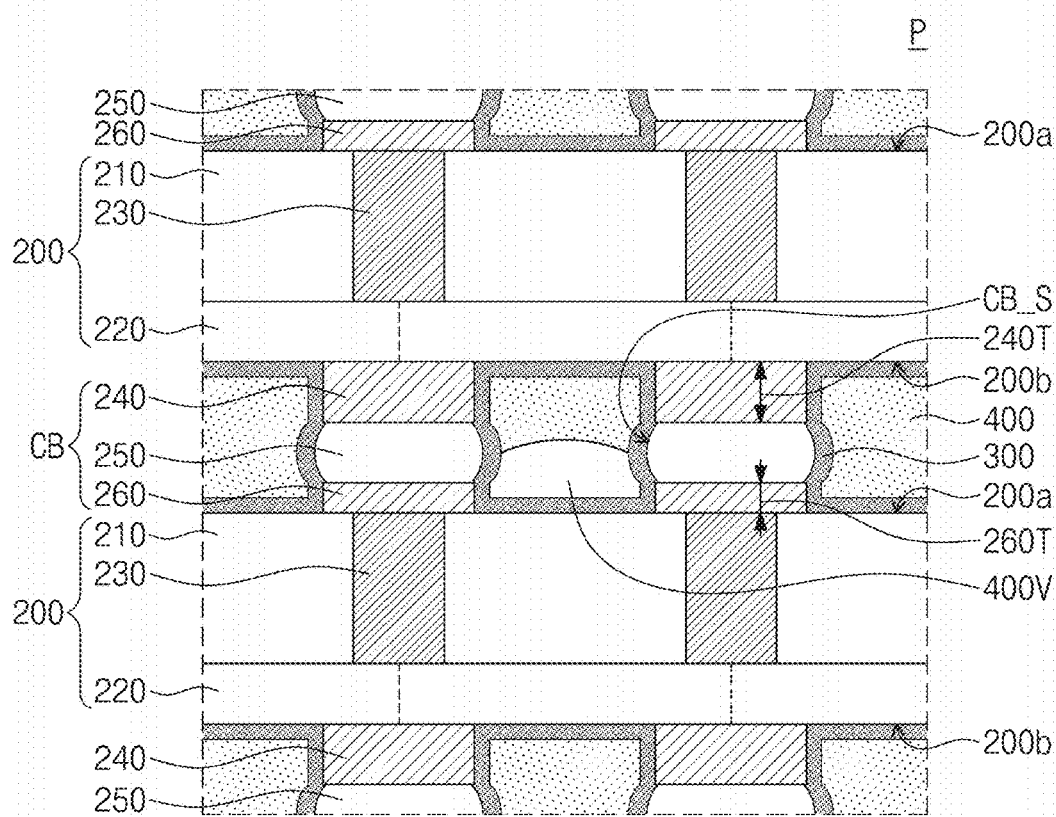
FIG. 2 illustrates an enlarged view showing section P shown in FIG. 1.
Figure 3:
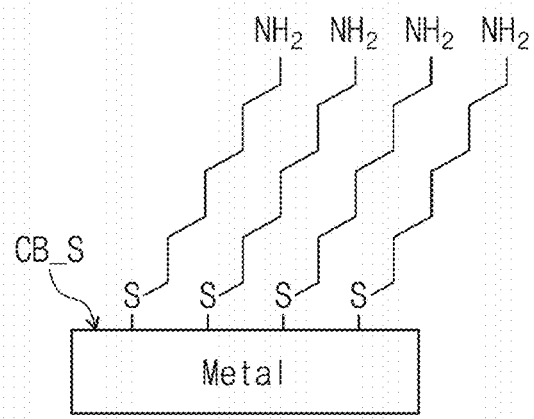
FIGS. 3 and 4 illustrate conceptual views showing a self-assembled monolayer in a protection layer of FIG. 1.
Figure 4:
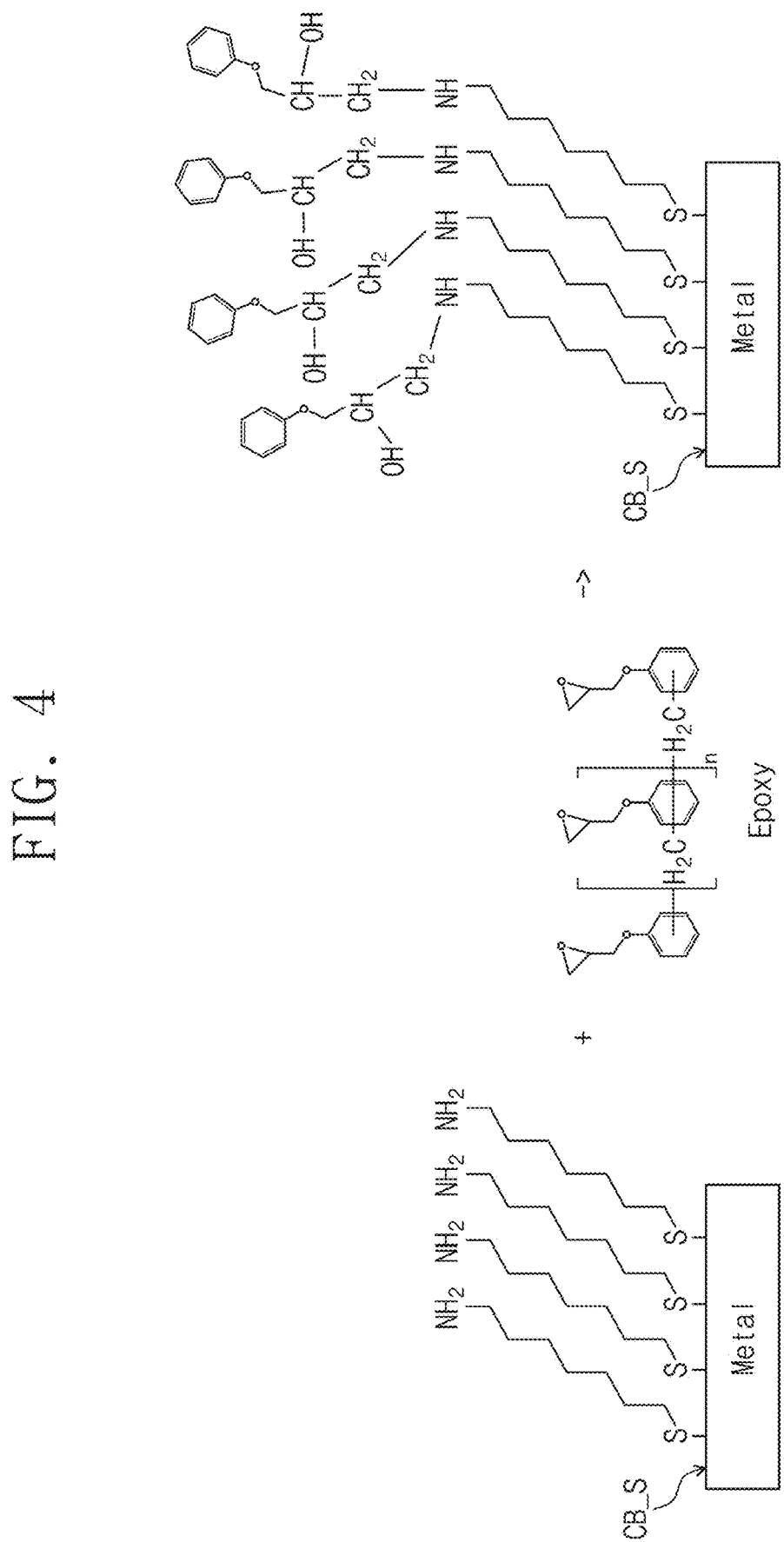

FIG. 1 illustrates a cross-sectional view showing a semiconductor package according to some example embodiments of the present inventive concepts. FIG. 2 illustrates an enlarged view showing section P shown in FIG. 1. FIGS. 3 and 4 illustrate conceptual views showing a self-assembled monolayer in a protection layer of FIG. 1.

Referring to FIG. 1, a semiconductor package 1000 may include a lower semiconductor chip 100 and a plurality of semiconductor chips 200 that are vertically stacked on the lower semiconductor chip 100. The lower semiconductor chip 100 may have a top surface 100a and a bottom surface 100b that are opposite to each other. The plurality of semiconductor chips 200 may be disposed on the top surface 100a of the lower semiconductor chip 100, and may be stacked on the lower semiconductor chip 100 along a first direction D1 perpendicular to the top surface 100a of the lower semiconductor chip 100. FIG. 1 depicts by way of example a structure in which eight semiconductor chips 200 are stacked on the lower semiconductor chip 100, but the present inventive concepts are not limited thereto.

The lower semiconductor chip 100 may include a lower semiconductor substrate 110, a lower circuit layer 120, lower through electrodes 130, lower chip pads 140, and lower bumps 150. The lower semiconductor substrate 110 may be one or more of a silicon substrate, a germanium substrate, and a silicon-germanium substrate, but example embodiments are not limited thereto. The lower circuit layer 120 may include integrated circuits formed on the lower semiconductor substrate 110. For example, the lower circuit layer 120 may be adjacent to the bottom surface 100b of the lower semiconductor chip 100.

The lower through electrodes 130 may penetrate the lower semiconductor substrate 110 and may be horizontally spaced apart from each other in the lower semiconductor substrate 110. The lower through electrodes 130 may be spaced apart from each other along a second direction D2 parallel to the top surface 100a of the lower semiconductor chip 100. The lower through electrodes 130 may be electrically connected to the lower circuit layer 120. The lower through electrodes 130 may include metal (e.g., copper, tungsten, titanium, or tantalum, but example embodiments are not limited thereto).

The lower chip pads 140 may be disposed on the bottom surface 100b of the lower semiconductor chip 100 and may be spaced apart from each other in the second direction D2. The lower chip pads 140 may be electrically connected to the lower circuit layer 120. The lower bumps 150 may be disposed on and connected to corresponding lower chip pads 140. The lower bumps 150 may be connected to external terminals. The lower chip pads 140 may include metal (e.g., copper). The lower bumps 150 may include a conductive material and may have at least one selected from solder-ball shapes, bump shapes, and pillar shapes.

Each of the plurality of semiconductor chips 200 may include a semiconductor substrate 210, a circuit layer 220, and chip through electrodes 230. According to some example embodiments, a topmost one 200U of the plurality of semiconductor chips 200 may not include the chip through electrodes 230. The semiconductor substrate 210 may be one or more of a silicon substrate, a germanium substrate, and a silicon-germanium substrate. The circuit layer 220 may include integrated circuits formed in the semiconductor substrate 210. Each of the plurality of semiconductor chips 200 may have a top surface 200a and a bottom surface 200b that are opposite to each other, and the circuit layer 220 may be adjacent to the bottom surface 200b of a corresponding one of the plurality of semiconductor chips 200. The chip through electrodes 230 may penetrate the semiconductor substrate 210 and may be horizontally spaced apart from each other in the semiconductor substrate 210. The chip through electrodes 230 may be spaced apart from each other in the second direction D2 and may be electrically connected to the circuit layer 220. The chip through electrodes 230 may include metal (e.g., copper, tungsten, titanium, or tantalum, but example embodiments are not limited thereto).

The semiconductor package 1000 may further include a plurality of connection bumps CB disposed between the lower semiconductor chip 100 and a bottommost one 200L of the plurality of semiconductor chips 200 and between the plurality of semiconductor chips 200. First connection bumps CB1 among the plurality of connection bumps CB may be disposed on the bottom surface 200b of the bottommost semiconductor chip 200L and may be spaced apart from each other in the second direction D2. The first connection bumps CB1 may be electrically connected to the circuit layer 220 of the bottommost semiconductor chip 200L and may be correspondingly coupled to the lower through electrodes 130 of the lower semiconductor chip 100. The bottommost semiconductor chip 200L may be electrically connected through the first connection bumps CB1 to the lower semiconductor chip 100. Second connection bumps CB2 among the plurality of connection bumps CB may be disposed on the bottom surface 200b of the remaining ones of the plurality of semiconductor chips 200, and may be spaced apart from each other in the second direction D2. The second connection bumps CB2 may be electrically connected to the circuit layer 220 of each of the remaining semiconductor chips 200. The second connection bumps CB2 may be connected to the chip through electrodes 230 of a corresponding one of the plurality of semiconductor chips 200. The plurality of semiconductor chips 200 may be electrically connected to each other through the second connection bumps CB2. The lower semiconductor chip 100 and the plurality of semiconductor chips 200 may be electrically connected to each other through the plurality of connection bumps CB.

The lower semiconductor chip 100 may be a memory chip, a logic chip, an application processor (AP) chip, or a system-on-chip (SoC). The plurality of semiconductor chips 200 may be memory chips. The plurality of semiconductor chips 200 may be the same semiconductor chips, for example, the same memory chips. The plurality of semiconductor chips 200 and the lower semiconductor chip 100 may be electrically connected to each other, and may constitute a high bandwidth memory (HBM) chip. The plurality of semiconductor chips 200 and the lower semiconductor chip 100 may each have a width in the second direction D2. According to some embodiments, the width 100WD of the lower semiconductor chip 100 may be greater than the width 200WD of each of the plurality of semiconductor chips 200.

Referring to FIGS. 1 and 2, each of the plurality of connection bumps CB may include a conductive pillar 240, a solder bump 250, and a conductive pad 260. The conductive pillar 240 may be adjacent to the bottom surface 200b of each of the plurality of semiconductor chips 200, and may be electrically connected to the circuit layer 220 of each of the plurality of semiconductor chips 200. The solder bump 250 may be disposed on and connected to the conductive pillar 240. The conductive pillar 240 may be interposed between the solder bump 250 and the bottom surface 200b of each of the plurality of semiconductor chips 200. The conductive pad 260 may be disposed on and connected to the solder bump 250. The conductive pillar 240 and the solder bump 250 may be interposed between the conductive pad 260 and the bottom surface 200b of each of the plurality of semiconductor chips 200. The conductive pad 260 may be adjacent to the top surface 200a of a corresponding one of the plurality of semiconductor chips 200 or to the top surface 100a of the lower semiconductor chip 100, and may be connected to one of the chips through electrodes 230 of the corresponding semiconductor chip 200 or to one of the lower through electrodes 130 of the lower semiconductor chip 100.

The conductive pillar 240 and the conductive pad 260 may include metal (e.g., copper). The conductive pillar 240 and the conductive pad 260 may have their respective thicknesses 240T and 260T in the first direction D1, and the thickness 240T of the conductive pillar 240 may be greater than the thickness 260T of the conductive pad 260. The solder bump 250 may include a conductive material and may have one of solder ball shapes, bump shapes, and pillar shapes.

The semiconductor package 1000 may further include a protection layer 300 that covers a lateral surface CB_S of each of the plurality of connection bumps CB, and also include a mold layer 400 that is disposed on the top surface 100a of the lower semiconductor chip 100 and covers lateral surfaces 200s of the plurality of semiconductor chips 200. The mold layer 400 may extend between the lower semiconductor chip 100 and the bottommost semiconductor chip 200L, and may fill a space between the first connection bumps CB1. The mold layer 400 may extend between the plurality of semiconductor chips 200 and may fill a space between the second connection bumps CB2. The mold layer 400 may extend with no boundary from the lateral surfaces 200s of the plurality of semiconductor chips 200 toward a space between the bottommost semiconductor chip 200L and the lower semiconductor chip 100 and toward spaces between the plurality of semiconductor chips 200.

The protection layer 300 may be interposed between the mold layer 400 and the lateral surface CB_S of each of the plurality of connection bumps CB. The protection layer 300 may cover a lateral surface of the solder bump 250, and may extend onto a lateral surface of the conductive pillar 240 and a lateral surface of the conductive pad 260. The protection layer 300 may be interposed between the mold layer 400 and the lateral surface of the solder bump 250, and may extend between the mold layer 400 and the lateral surface of the conductive pillar 240 and between the mold layer 400 and the lateral surface of the conductive pad 260.

The protection layer 300 may be in contact with the lateral surface CB_S of each of the plurality of connection bumps CB. The protection layer 300 may be in contact with the lateral surface of the solder bump 250, the lateral surface of the conductive pillar 240, and the lateral surface of the conductive pad 260. The protection layer 300 may be in contact with the mold layer 400. The mold layer 400 may include a molded under-fill (MUF) material, for example, an epoxy molding compound (EMC). The mold layer 400 may further include a thermal radiation material, and the thermal radiation material may include at least one selected from $Al_2O_3$, BeO, AN, SiC, and BN.

According to some embodiments, the protection layer 300 may extend onto the top and bottom surfaces 200a and 200b of each of the plurality of semiconductor chips 200 and onto the lateral surface 200s of each of the plurality of semiconductor chips 200. The protection layer 300 may extend onto the top surface 100a of the lower semiconductor chip 100. The protection layer 300 may extend between the mold layer 400 and the bottom surface 200b of each of the plurality of semiconductor chips 200 and between the mold layer 400 and the top surface 200a of each of the plurality of semiconductor chips 200. The protection layer 300 may further extend between the mold layer 400 and the lateral surface 200s of each of the plurality of semiconductor chips 200. The protection layer 300 may extend between the mold layer 400 and the top surface 100a of the lower semiconductor chip 100.

According to some example embodiments, the protection layer 300 may include a self-assembled monolayer. The self-assembled monolayer may include a hydrocarbon chain, a first reaction group connected to one end of the hydrocarbon chain, and a second reaction group connected to an opposite end of the hydrocarbon chain. For example, the self-assembled monolayer may be expressed by a chemical formula described below.

$$R1\text{-}C_nH_{2n}\text{---}R2 \qquad \text{[Chemical Formula]}$$

In the Chemical Formula above, n may be an integer equal to or greater than 1. R1 may indicate the first reaction group, which reacts with the plurality of connection bumps CB. R1 may be, for example, one of —SH, —COOH, and —SiH$_3$. R2 may represent the second reaction group, which reacts with the mold layer 400. For example, R2 may be one of —OH, —NH$_2$, an imidazole group, and an epoxy group.

The first reaction group may chemically adsorb the self-assembled monolayer to the lateral surface CB_S of each of the plurality of connection bumps CB, and the second reaction group may chemically adsorb the self-assembled monolayer to a surface of the mold layer 400. According to some embodiments, the self-assembled monolayer may include at least one selected from thiol, carboxylic acid, aminosilane, and epoxysilane, but example embodiments are not limited thereto.

Referring to FIGS. 2 to 4, when —SH is given as the first reaction group R1 of the self-assembled monolayer, and when —NH$_2$ is given as the second reaction group R2 of the self-assembled monolayer, the first reaction group R1 may react with metal in each of the plurality of connection bumps CB, and thus the self-assembled monolayer may be chemically adsorbed to the lateral surface CB_S of each of the plurality of connection bumps CB. The second reaction group R2 of the self-assembled monolayer may react with epoxy in the mold layer 400, and thus the self-assembled monolayer may be chemically adsorbed to the surface of the mold layer 400, but example embodiments are not limited thereto.

Referring back to FIGS. 1 and 2, according to some example embodiments, the protection layer 300 may include an inorganic dielectric material. For example, the protection layer 300 may include at least one selected from $SiO_2$, $Si_3N_4$, phosphosilicate glass (PSG or $SiO_2/P_2O_5$), and borophosphosilicate glass (BPSG or $SiO_2/P_2O_5/B_2O_3$), but example embodiments are not limited thereto.

The semiconductor package 1000 may further include at least one void 400V formed in the mold layer 400. The at least one void 400V may be formed between the bottommost semiconductor chip 200L and the lower semiconductor chip 100 and/or in the mold layer 400 between the plurality of semiconductor chips 200. The at least one void 400V may be disposed between the first connection bumps CB1 and/or between the second connection bumps CB2, and may expose at least a portion of the protection layer 300.

The plurality of connection bumps CB may include a pair of connection bumps CB that neighbor each other with the at least one void 400V therebetween. The protection layer 300 may be interposed between the at least one void 400V and each of the pair of connection bumps CB. According to some embodiments, the protection layer 300 may extend between the at least one void 400V and the lower semiconductor chip 100 or between the at least one void 400V and each of the plurality of semiconductor chips 200. Each of the pair of connection bumps CB may be spaced apart from the mold layer 400 and the at least one void 400V with the protection layer 300 interposed therebetween.

As the mold layer 400 includes a molded under-fill (MUF) material, the at least one void 400V may be formed in the mold layer 400 between the bottommost semiconductor chip 200L and the lower semiconductor chip 100 and/or between the plurality of semiconductor chips 200. When the at least one void 400V is formed between a pair of neighboring connection bumps CB, at least one solder bump 250 among the pair of connection bumps CB may be extruded through the at least one void 400V in a subsequent process, and as a result, the pair of connection bumps CB may be electrically shorted to each other.

According to the present inventive concepts, the protection layer 300 may be formed to cover the lateral surface CB_S of each of the plurality of connection bumps CB, and may be interposed between the mold layer 400 and the lateral surface CB_S of each of the plurality of connection bumps CB. When the at least one void 400V is formed in the mold layer 400 between a pair of neighboring connection bumps CB, the protection layer 300 may be interposed between the mold layer 400 and each of the pair of connection bumps CB, and may extend between the at least one void 400V and each of the pair of connection bumps CB. Each of the pair of connection bumps CB may be spaced apart from the at least one void 400V across the protection layer 300. Therefore, the solder bump 250 of at least one of the pair of connection bumps CB may be prevented or mitigated from being extruded through the at least one void 400V in a subsequent process, and as a result, it may be possible to prevent or mitigate an electric short between the pair of connection bumps CB.

In addition, as the mold layer 400 includes a molded under-fill (MUF) material, the mold layer 400 may cover the lateral surfaces 200s of the plurality of semiconductor chips 200, and may extend with no boundary from the lateral surfaces 200s of the plurality of semiconductor chips 200 toward a space between the bottommost semiconductor chip 200L and the lower semiconductor chip 100 and toward spaces between the plurality of semiconductor chips 200. For example, the mold layer 400 may serve as an under-fill layer between the lower semiconductor chip 100 and the plurality of semiconductor chips 200, and may also serve as a molding compound that covers the lateral surfaces 200s of the plurality of semiconductor chips 200. Accordingly, it may be possible to simplify a method of fabricating the semiconductor package 1000. In addition, as the mold layer 400 includes a molded under-fill (MUF) material, it may be possible to easily increase an amount of a thermal radiation material in the mold layer 400. Accordingly, the semiconductor package 1000 may improve in thermal radiation properties.

In conclusion, there may be provided a semiconductor package with increased electrical characteristics and improved thermal radiation properties and also be provided a simplified method of fabricating a semiconductor package.

Figure 5:
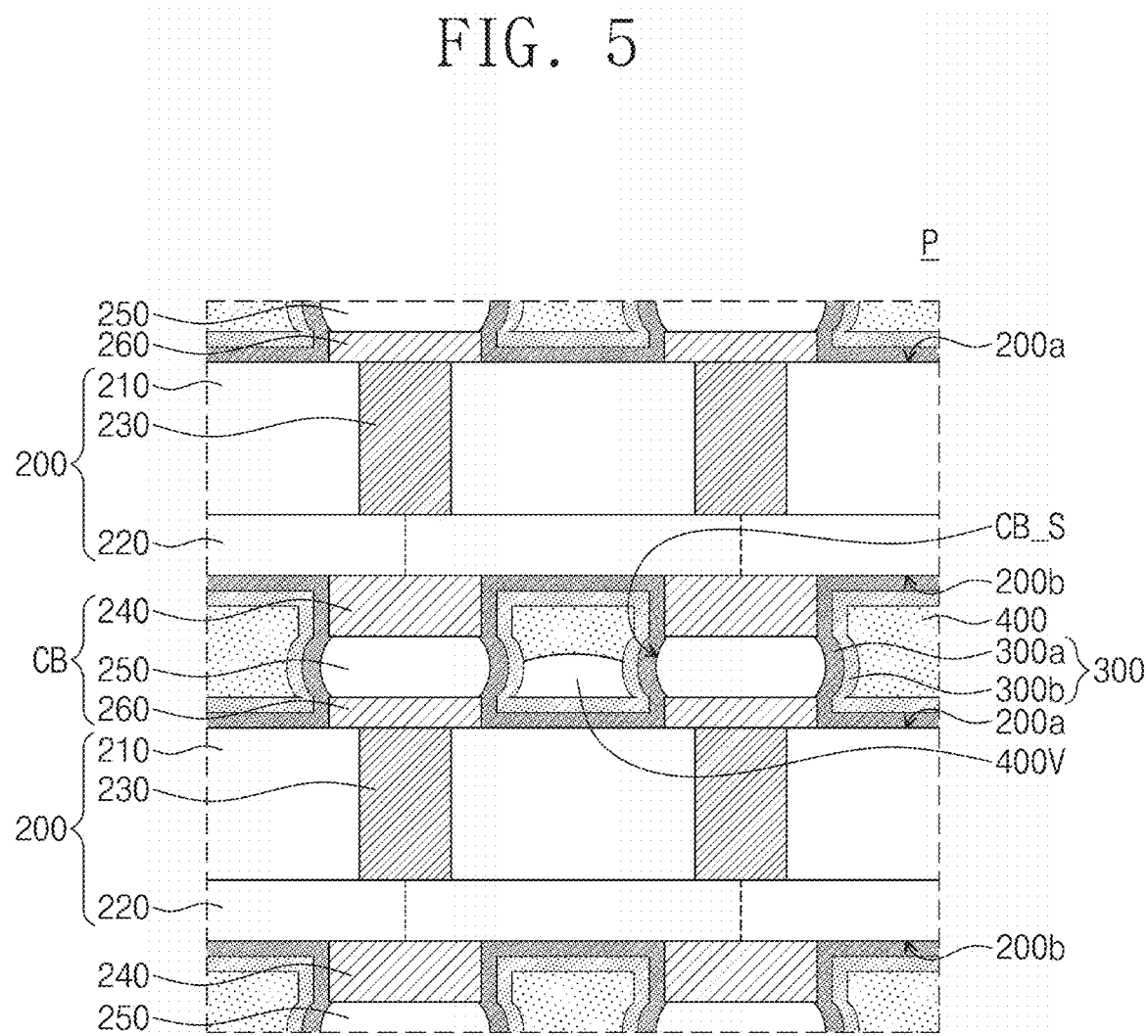
FIG. 5 illustrates an enlarged view of section P depicted in FIG. 1, showing a semiconductor package according to some example embodiments of the present inventive concepts.

FIG. 5 illustrates an enlarged view of section P depicted in FIG. 1, showing a semiconductor package according to some example embodiments of the present inventive concepts. The following semiconductor package is similar to that discussed with reference to FIGS. 1 to 4, and thus major differences between the semiconductor packages will be described below in the interest of brevity of description.

Referring to FIGS. 1 and 5, according to some example embodiments, the protection layer 300 may be a double layer including a self-assembled monolayer 300a and an organic dielectric layer 300b. The self-assembled monolayer 300a may be substantially the same as the self-assembled monolayer discussed with reference to FIGS. 1 to 4. The first reaction group may chemically adsorb the self-assembled monolayer 300a to the lateral surface CB_S of each of the plurality of connection bumps CB. The organic dielectric layer 300b may be interposed between the self-assembled monolayer 300a and the mold layer 400. The second reaction group may chemically adsorb the self-assembled monolayer 300a to a surface of the organic dielectric layer 300b. The organic dielectric layer 300b may include, for example, epoxy resin.

Referring to FIGS. 3 to 5, when —SH is given as the first reaction group R1 of the self-assembled monolayer 300a, and when —NH$_2$ is given as the second reaction group R2 of the self-assembled monolayer 300a, the first reaction group R1 may react with metal in each of the plurality of connection bumps CB, and thus the self-assembled monolayer 300a may be chemically adsorbed to the lateral surface CB_S of each of the plurality of connection bumps CB. The second reaction group R2 of the self-assembled monolayer 300a may react with epoxy in the organic dielectric layer 300b, and thus the self-assembled monolayer 300a may be chemically adsorbed to a surface of the organic dielectric layer 300b.

Referring back to FIGS. 1 and 5, at least one void 400V may be provided between a pair of neighboring connection bumps CB. The at least one void 400V may expose at least a portion of the organic dielectric layer 300b.

Figure 6:
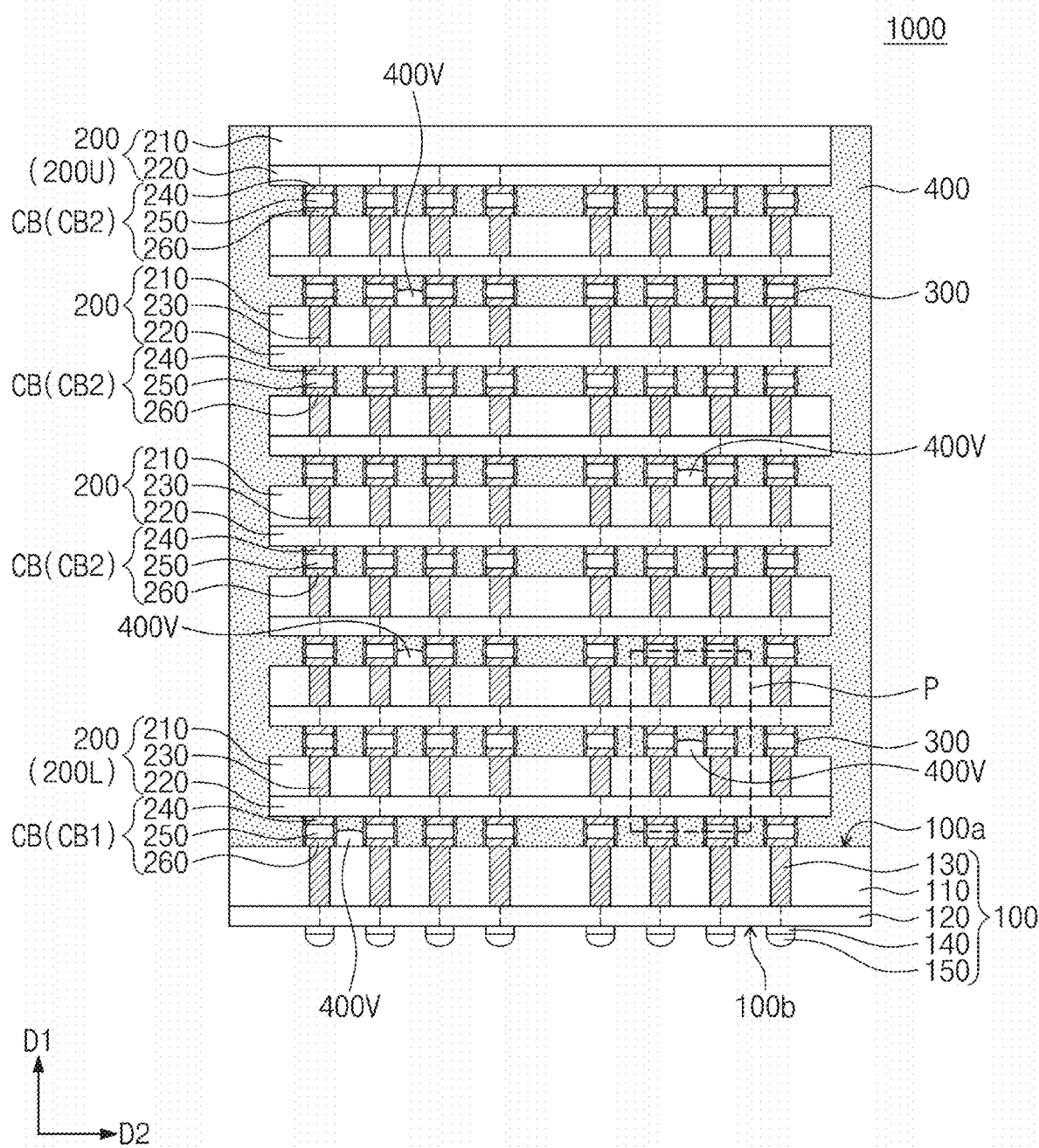
FIG. 6 illustrates a cross-sectional view showing a semiconductor package according to some example embodiments of the present inventive concepts.
Figure 7:
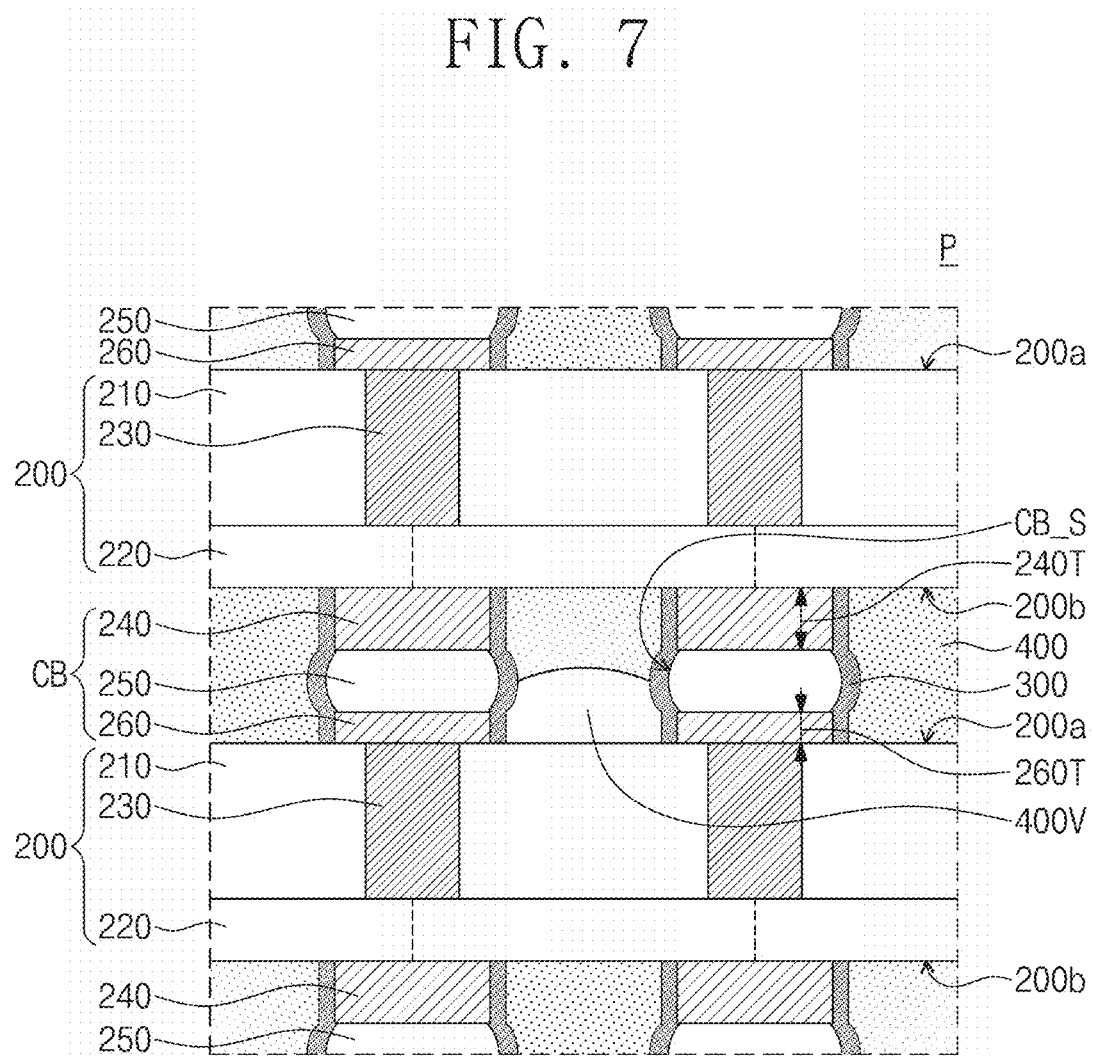
FIG. 7 illustrates an enlarged view showing section P of FIG. 6.

FIG. 6 illustrates a cross-sectional view showing a semiconductor package according to some example embodiments of the present inventive concepts. FIG. 7 illustrates an enlarged view showing section P of FIG. 6. The following semiconductor package is similar to that discussed with reference to FIGS. 1 to 4, and thus major differences between the semiconductor packages will be described below in the interest of brevity of description.

Referring to FIGS. 6 and 7, the protection layer 300 may be interposed between the mold layer 400 and the lateral surface CB_S of each of the plurality of connection bumps CB. The protection layer 300 may cover a lateral surface of the solder bump 250, and may extend onto a lateral surface of the conductive pillar 240 and a lateral surface of the conductive pad 260. The protection layer 300 may be interposed between the mold layer 400 and the lateral surface of the solder bump 250, and may extend between the mold layer 400 and the lateral surface of the conductive pillar 240 and between the mold layer 400 and the lateral surface of the conductive pad 260. The protection layer 300 may be in contact with the lateral surface CB_S of each of the plurality of connection bumps CB. The protection layer 300 may be in contact with the lateral surface of the solder bump 250, the lateral surface of the conductive pillar 240, and the lateral surface of the conductive pad 260. The protection layer 300 may be in contact with the mold layer 400.

According to some embodiments, the protection layer 300 may be provided locally on the lateral surface CB_S of each of the plurality of connection bumps CB. The mold layer 400 may be in contact with the top and bottom surfaces 200a and 200b of each of the plurality of semiconductor chips 200, and may also be in contact with the lateral surface 200s of each of the plurality of semiconductor chips 200. The mold layer 400 may be in contact with the top surface 100a of the lower semiconductor chip 100.

According to some example embodiments, the protection layer 300 may include a self-assembled monolayer. The first reaction group may chemically adsorb the self-assembled monolayer to the lateral surface CB_S of each of the plurality of connection bumps CB, and the second reaction group may chemically adsorb the self-assembled monolayer to a surface of the mold layer 400. According to some example embodiments, the protection layer 300 may include an inorganic dielectric material. For example, the protection layer 300 may include at least one selected from $SiO_2$, $Si_3N_4$, phosphosilicate glass (PSG or $SiO_2/P_2O_5$), and borophosphosilicate glass (BPSG or $SiO_2/P_2O_5/B_2O_3$), but example embodiments are not limited thereto.

At least one void 400V may be formed between a pair of neighboring connection bumps CB. The protection layer 300 may be interposed between the at least one void 400V and each of the pair of connection bumps CB. The at least one void 400V may expose the top surface 100a of the lower semiconductor chip 100 between the pair of connection bumps CB or may expose the top surface 200a (or the bottom surface 200b) of each semiconductor chip 200 between the pair of connection bumps CB. Each of the pair of connection bumps CB may be spaced apart across the protection layer 300 from the mold layer 400 and the at least one void 400V.

The semiconductor package 1000 according to some embodiments may be substantially the same as the semiconductor package 1000 discussed with reference to FIGS. 1 and 4, except for the mentioned above.

Figure 8:
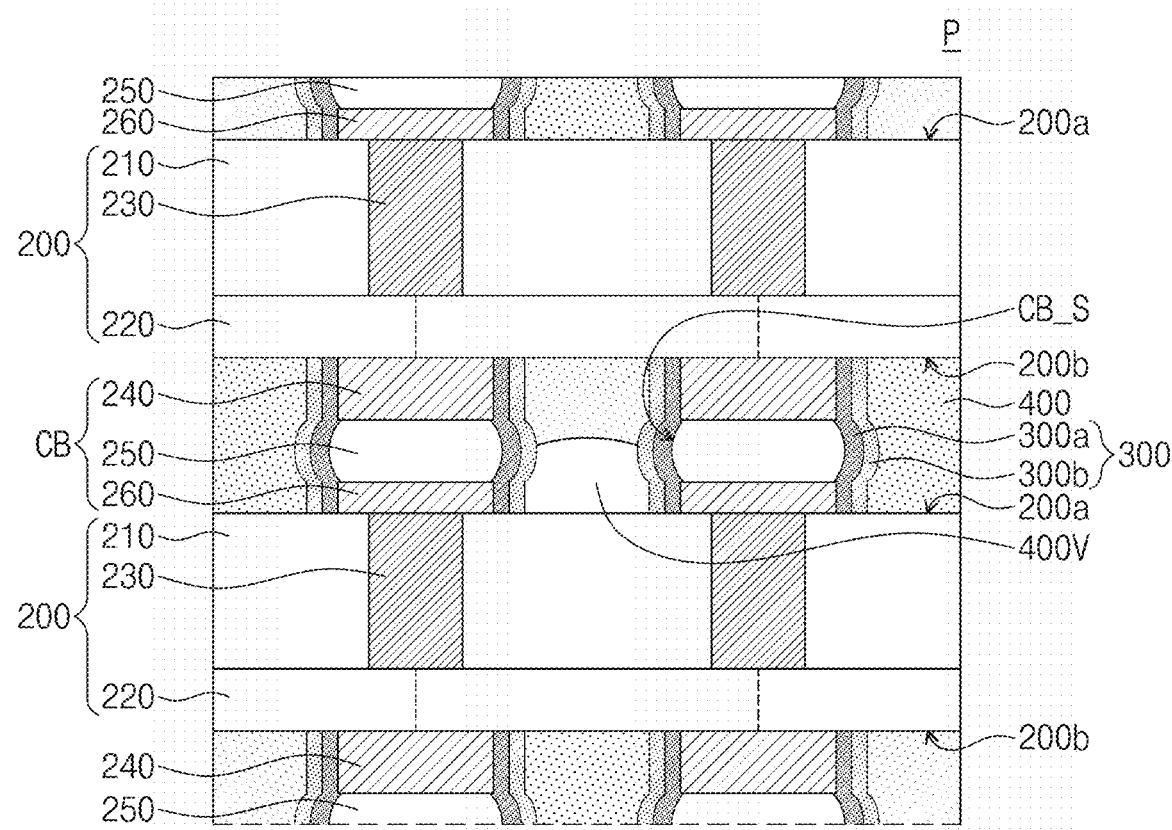
FIG. 8 illustrates an enlarged view of section P depicted in FIG. 6, showing a semiconductor package according to some example embodiments of the present inventive concepts.

FIG. 8 illustrates an enlarged view of section P depicted in FIG. 6, showing a semiconductor package according to some example embodiments of the present inventive concepts. The following semiconductor package is similar to that discussed with reference to FIGS. 1 to 4, and thus major differences between the semiconductor packages will be described below in the interest of brevity of description.

Referring to FIGS. 6 and 8, according to some example embodiments, the protection layer 300 may be a double layer including a self-assembled monolayer 300a and an organic dielectric layer 300b. The self-assembled monolayer 300a may be substantially the same as the self-assembled monolayer discussed with reference to FIGS. 1 to 4. The first reaction group may chemically adsorb the self-assembled monolayer 300a to the lateral surface CB_S of each of the plurality of connection bumps CB. The organic dielectric layer 300b may be interposed between the self-assembled monolayer 300a and the mold layer 400. The second reaction group may chemically adsorb the self-assembled monolayer 300a to a surface of the organic dielectric layer 300b. The organic dielectric layer 300b may include, for example, epoxy resin.

Referring to FIGS. 3, 4, and 8, when —SH is given as the first reaction group R1 of the self-assembled monolayer 300a, and when —$NH_2$ is given as the second reaction group R2 of the self-assembled monolayer 300a, the first reaction group R1 may react with metal in each of the plurality of connection bumps CB, and thus the self-assembled monolayer 300a may be chemically adsorbed to the lateral surface CB_S of each of the plurality of connection bumps CB. The second reaction group R2 of the self-assembled monolayer 300a may react with epoxy in the organic dielectric layer 300b, and thus the self-assembled monolayer 300a may be chemically adsorbed to a surface of the organic dielectric layer 300b.

Referring back to FIGS. 6 and 8, at least one void 400V may be provided between a pair of neighboring connection bumps CB. The at least one void 400V may expose at least a portion of the organic dielectric layer 300b, and may also expose the top surface 100a of the lower semiconductor chip 100 between the pair of connection bumps CB or the top surface 200a (or the bottom surface 200b) of each semiconductor chip 200 between the pair of connection bumps CB.

Figure 9:
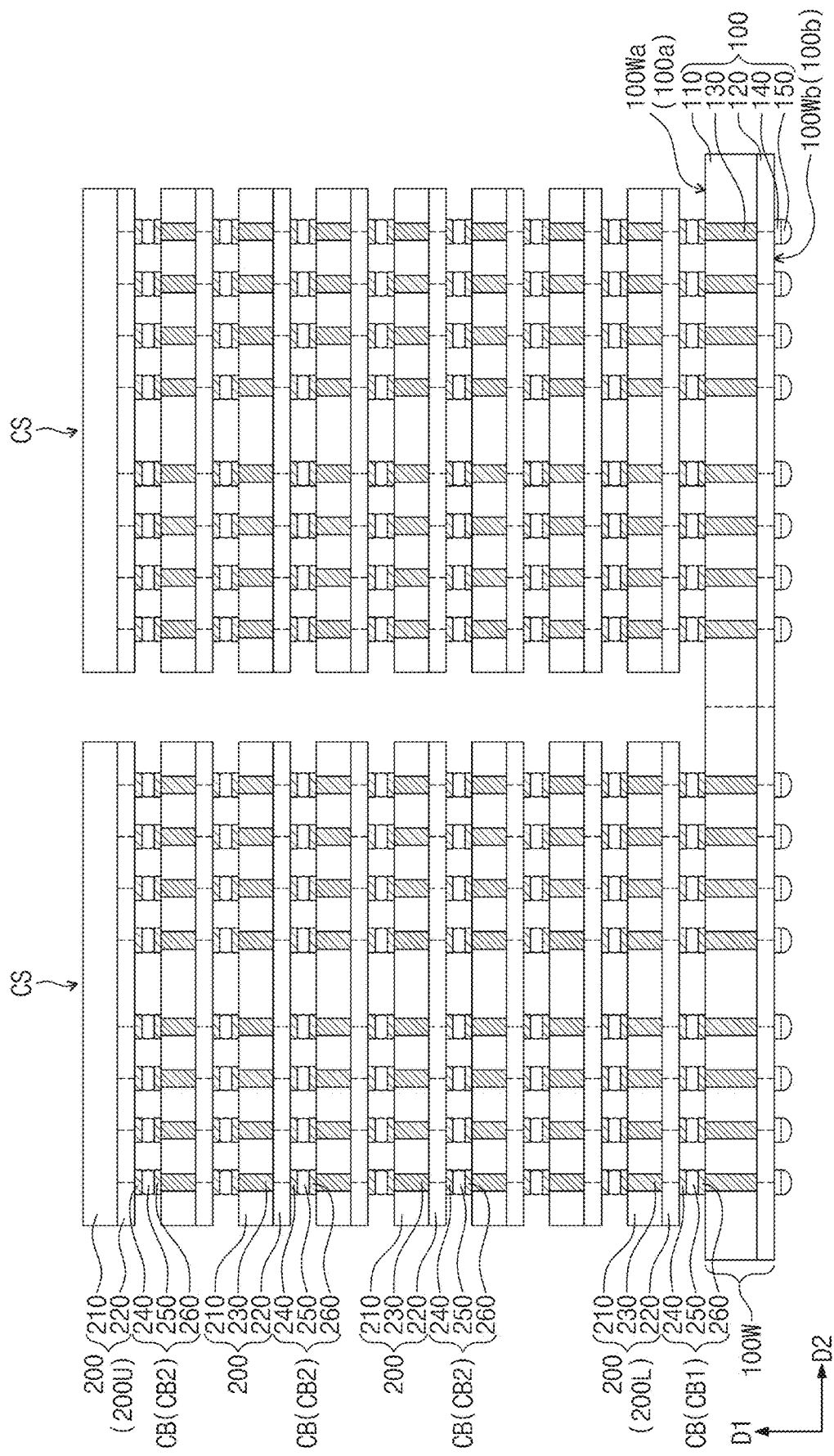
FIGS. 9 to 11 illustrate cross-sectional views showing a method of fabricating a semiconductor package according to some example embodiments of the present inventive concepts.
Figure 10:
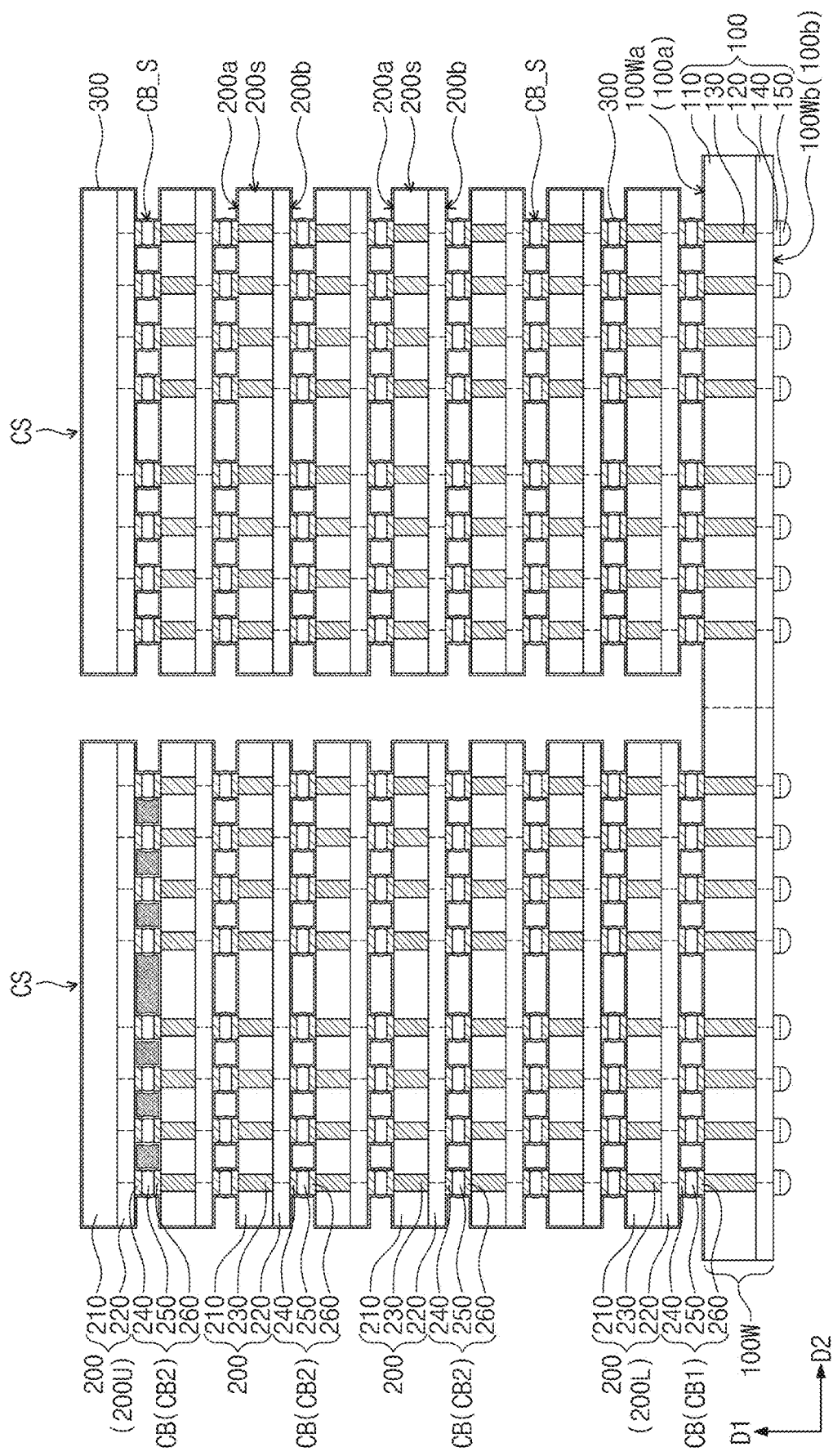
Figure 11:
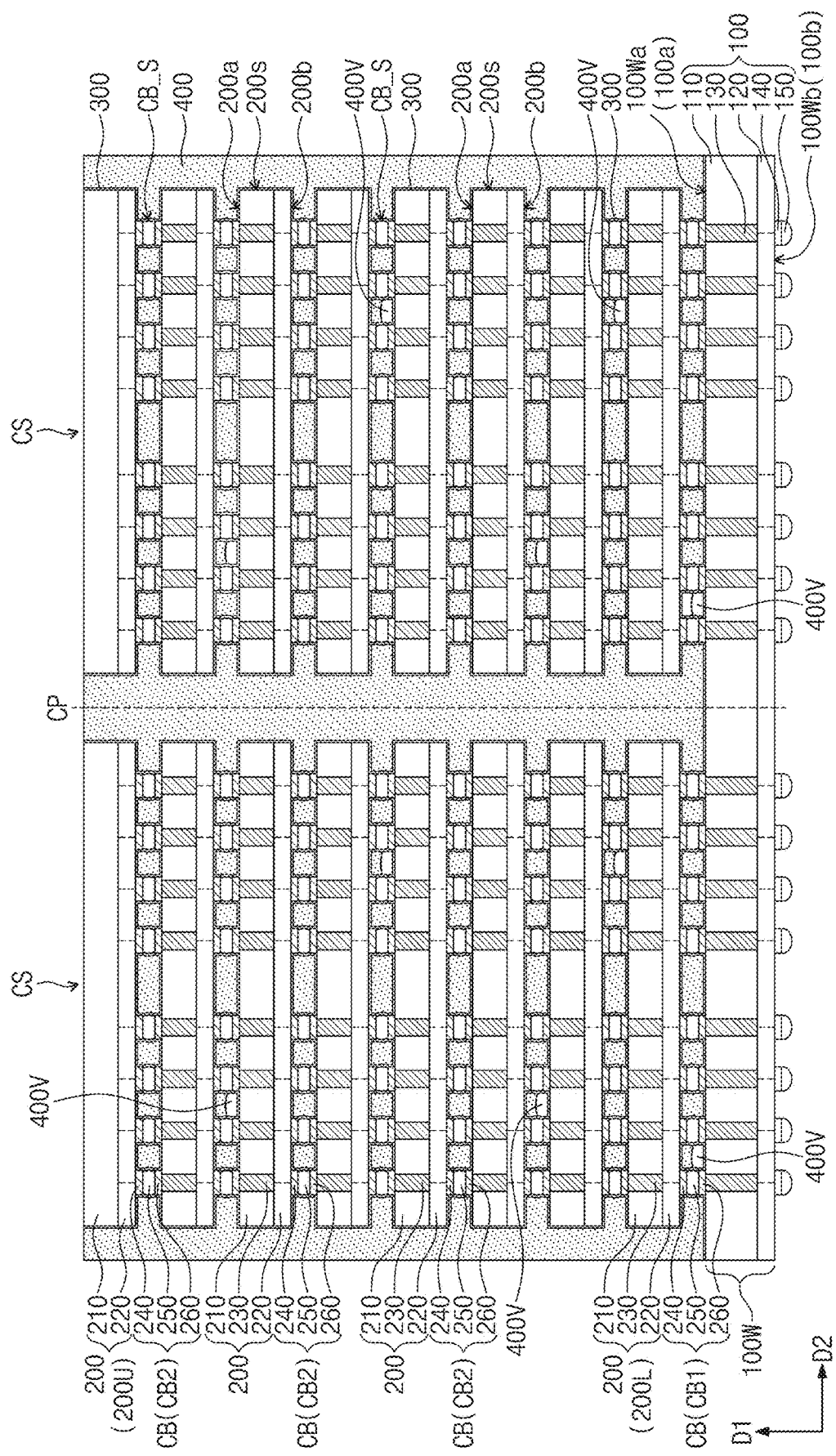

FIGS. 9 to 11 illustrate cross-sectional views showing a method of fabricating a semiconductor package according to some example embodiments of the present inventive concepts. The same technical features as those of the semiconductor package discussed with reference to FIGS. 1 to 8 may be omitted for brevity of description.

Referring to FIG. 9, a lower substrate 100W may be provided which includes a plurality of lower semiconductor chips 100. The lower substrate 100W may have a top surface 100Wa and a bottom surface 100Wb that are opposite to each other. The top surface 100Wa of the lower substrate 100W may correspond to top surfaces 100a of the plurality of lower semiconductor chips 100, and the bottom surface 100Wb of the lower substrate 100W may correspond to bottom surfaces 100b of the plurality of lower semiconductor chips 100. The plurality of lower semiconductor chips 100 may be arranged in a direction (e.g., the second direction D2) parallel to the top surface 100Wa of the lower substrate 100W. Each of the plurality of lower semiconductor chips 100 may include the lower semiconductor substrate 110, the lower circuit layer 120, the lower through electrodes 130, the lower chip pads 140, and the lower bumps 150, which are discussed above with reference to FIG. 1.

A plurality of chip stacks CS may be provided on the top surface 100Wa of the lower substrate 100W and may be correspondingly provided on the plurality of lower semiconductor chips 100. Each of the plurality of chip stacks CS may include a plurality of semiconductor chips 200 that are vertically stacked in the first direction D1, and may also include a plurality of connection bumps CB that are disposed on a bottom surface 200b of each of the plurality of semiconductor chips 200. Each of the plurality of semiconductor chips 200 may include the semiconductor substrate 210, the circuit layer 220, and the chip through electrodes 230, which are discussed with reference to FIG. 1. According to some example embodiments, a topmost one 200U of the plurality of semiconductor chips 200 may not include the chip through electrodes 230. Each of the plurality of connection bumps CB may include the conductive pillar 240, the solder bump 250, and the conductive pad 260, which are discussed with reference to FIGS. 1 and 2.

First connection bumps CB1 among the plurality of connection bumps CB may be disposed between a bottommost one 200L among the plurality of semiconductor chips 200 and a corresponding lower semiconductor chip 100, and second connection bumps CB2 among the plurality of connection bumps CB may be disposed between the plurality of semiconductor chips 200. The plurality of semiconductor chips 200 may be electrically connected to each other through the second connection bumps CB2, and the bottommost semiconductor chip 200L may be electrically connected to the corresponding lower semiconductor chip 100 through the first connection bumps CB1. Therefore, each of the chip stacks CS may be electrically connected to the corresponding lower semiconductor chip 100.

Referring to FIG. 10, the protection layer 300 may be formed on the lower substrate 100W to cover the plurality of chip stacks CS. According to some embodiments, the protection layer 300 may be formed to cover top surfaces 200a, lateral surfaces 200s, and bottom surfaces 200b of the plurality of semiconductor chips 200, and also to cover a lateral surface CB_S of each of the plurality of connection bumps CB. The protection layer 300 may be formed to cover the top surface 100Wa of the lower substrate 100W. According to some example embodiments, as discussed with reference to FIGS. 6 to 8, the protection layer 300 may be formed locally on the lateral surface CB_S of each of the plurality of connection bumps CB.

According to some example embodiments, the protection layer 300 may be formed of a single layer including the self-assembled monolayer or the inorganic dielectric material, as discussed with reference to FIGS. 1 to 4, 6, and 7. According to some embodiments, the protection layer 300 may be formed of a double layer including the self-assembled monolayer 300a and the organic dielectric layer 300b, as discussed with reference to FIGS. 5 and 8.

The protection layer 300 may be formed by using, for example, at least one selected from spray coating, dipping coating, spin coating, sputtering deposition, electro-deposition, and chemical vapor deposition, but example embodiments are not limited thereto.

Referring to FIG. 11, a mold layer 400 may be formed on the lower substrate 100W to cover the plurality of chip stacks CS and the protection layer 300. The mold layer 400 may be formed to cover the lateral surfaces 200s of the plurality of semiconductor chips 200 and to extend between the plurality of semiconductor chips 200. The mold layer 400 may be formed to extend between the lower substrate 100W and each of the plurality of chip stacks CS. The mold layer 400 may extend between the plurality of semiconductor chips 200 to fill a space between the second connection bumps CB2, and may extend between the lower substrate 100W and each of the plurality of chip stacks CS to fill a space between the first connection bumps CB1.

The protection layer 300 may be interposed between the mold layer 400 and the lateral surface CB_S of each of the plurality of connection bumps CB. According to some embodiments, the protection layer 300 may extend between the mold layer 400 and the bottom surface 200b of each of the plurality of semiconductor chips 200 and between the mold layer 400 and the top surface 200a of each of the plurality of semiconductor chips 200. The protection layer 300 may further extend between the mold layer 400 and the lateral surface 200s of each of the plurality of semiconductor chips 200. The protection layer 300 may extend between the mold layer 400 and the top surface 100a of each of the lower semiconductor chips 100.

The mold layer 400 may include a molded under-fill (MUF) material, for example, an epoxy molding compound (EMC). The mold layer 400 may further include a thermal radiation material. The mold layer 400 may be formed by using, for example, at least one selected from a compression molding process and a transfer molding process.

After the mold layer 400 is formed, a cutting process CP may be performed on the lower substrate 100W. The cutting process CP may include, for example, using a blade to cut the mold layer 400 between the plurality of chip stacks CS and to cut the lower substrate 100W between the plurality of lower semiconductor chips 100. Each of the plurality of lower semiconductor chips 100 and each of the plurality of chip stacks CS may constitute the semiconductor package 1000 discussed with reference to FIGS. 1 to 8.

Figure 12:
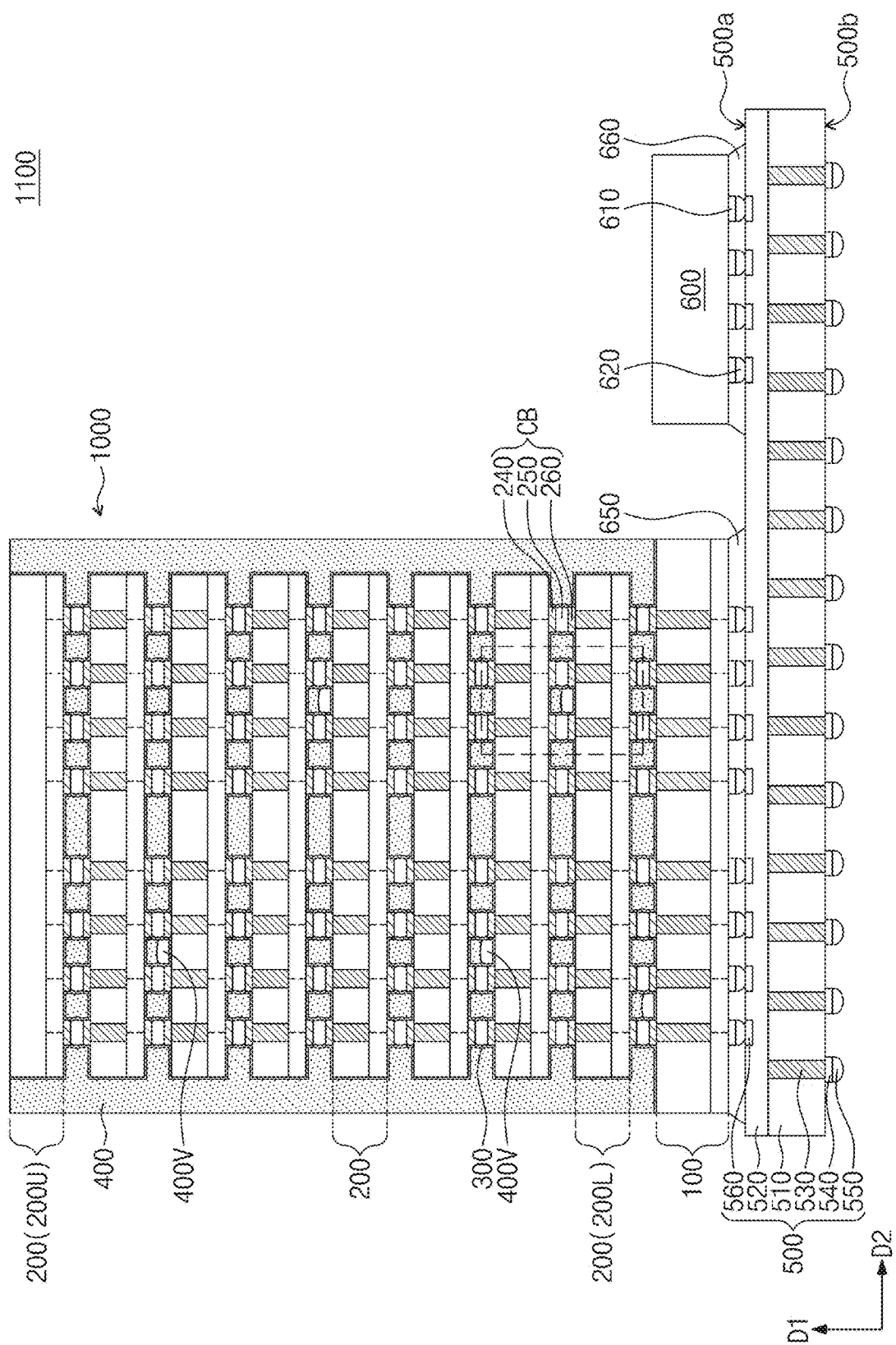
FIG. 12 illustrates a cross-sectional view showing a semiconductor package according to some example embodiments of the present inventive concepts.

FIG. 12 illustrates a cross-sectional view showing a semiconductor package according to some example embodiments of the present inventive concepts. The following semiconductor package is similar to that discussed with reference to FIGS. 1 to 8, and thus major differences between the semiconductor packages will be described below in the interest of brevity of description.

Referring to FIG. 12, a semiconductor package 1100 may include a first substrate 500, and also include a unit chip package 1000 and an additional semiconductor chip 600 that are mounted on the first substrate 500.

The first substrate 500 may be an interposer substrate. The first substrate 500 may include a base substrate 510, a plurality of through electrodes 530 that penetrate the base substrate 510, and a wiring layer 520 on the base substrate 510. The base substrate 510 may be, for example, a silicon substrate. The plurality of through electrodes 530 may be horizontally spaced apart from each other in the base substrate 510, and each of the plurality of through electrodes 530 may penetrate the base substrate 510. The plurality of through electrodes 530 may include metal, such as copper (Cu). The wiring layer 520 may include metal patterns electrically connected to the plurality of through electrodes 530.

The first substrate 500 may have a first surface 500a and a second surface 500b that are opposite to each other, and the wiring layer 520 may be adjacent to the first surface 500a. The second surface 500b of the first substrate 500 may correspond to one surface of the base substrate 510. Each of the plurality of through electrodes 530 may extend from the wiring layer 520 toward the second surface 500b.

First substrate pads 560 may be disposed adjacent to the first surface 500a of the first substrate 500. The first substrate pads 560 may be spaced apart from each other along a direction (e.g., the second direction D2) parallel to the first surface 500a of the first substrate 500. The first substrate pads 560 may be connected to the metal patterns in the wiring layer 520, and may be electrically connected through the metal patterns to the plurality of through electrodes 530. The first substrate pads 560 may include a conductive material (e.g., metal).

Second substrate pads 540 may be disposed on the second surface 500b of the first substrate 500. The second substrate pads 540 may be spaced apart from each other along a direction (e.g., the second direction D2) parallel to the second surface 500b of the first substrate 500. Each of the plurality of through electrodes 530 may be connected to a corresponding one of the second substrate pads 540. The second substrate pads 540 may include a conductive material (e.g., metal).

First bumps 550 may be disposed on the second surface 500b of the first substrate 500 and correspondingly connected to the second substrate pads 540. The first bumps 550 may be correspondingly located on the second substrate pads 540. The first bumps 550 may include a conductive material and may have one of solder ball shapes, bump shapes, and pillar shapes.

The unit chip package 1000 and the additional semiconductor chip 600 may be mounted on the first surface 500a of the first substrate 500. The unit chip package 1000 and the additional semiconductor chip 600 may be spaced apart from each other in a direction (e.g., the second direction D2)

parallel to the first surface 500a of the first substrate 500. According to some embodiments, the unit chip package 1000 may be the semiconductor package 1000 discussed with reference to FIGS. 1 to 8. In this case, the lower semiconductor chip 100 of the unit chip package 1000 may be disposed on the first surface 500a of the first substrate 500, and the lower bumps 150 of the lower semiconductor chip 100 may be connected to corresponding first substrate pads 560 of the first substrate 500. The unit chip package 1000 may be electrically connected to the wiring layer 520 of the first substrate 500 through the lower bumps 150 and the corresponding first substrate pads 560.

A first under-fill layer 650 may be interposed between the first substrate 500 and the lower semiconductor chip 100 of the unit chip package 1000, and may cover the lower bumps 150 of the lower semiconductor chip 100. The first under-fill layer 650 may include a dielectric polymer material, such as epoxy resin.

The additional semiconductor chip 600 may be horizontally spaced apart from the unit chip package 1000. The additional semiconductor chip 600 may be mounted and spaced apart from the lower semiconductor chip 100 of the unit chip package 1000. The additional semiconductor chip 600 may include additional chip pads 610 disposed on one surface thereof, and also include additional bumps 620 connected to corresponding additional chip pads 610. The additional bumps 620 may be connected to corresponding first substrate pads 560 of the first substrate 500. The additional semiconductor chip 600 may be electrically connected to the wiring layer 520 of the first substrate 500 through the additional chip pads 610, the additional bumps 620, and the corresponding first substrate pads 560.

A second under-fill layer 660 may be interposed between the additional semiconductor chip 600 and the first substrate 500, and may cover the additional bumps 620 of the additional semiconductor chip 600. The second under-fill layer 660 may include a dielectric polymer material, such as epoxy resin.

The unit chip package 1000 and the additional semiconductor chip 600 may be electrically connected to each other through the metal pattern in the wiring layer 520 of the first substrate 500. For example, the unit chip package 1000 may be a high bandwidth memory (HBM) chip, and the additional semiconductor chip 600 may be a memory chip, a logic chip, an application processor (AP) chip, or a system-on-chip (SoC).

Figure 13:
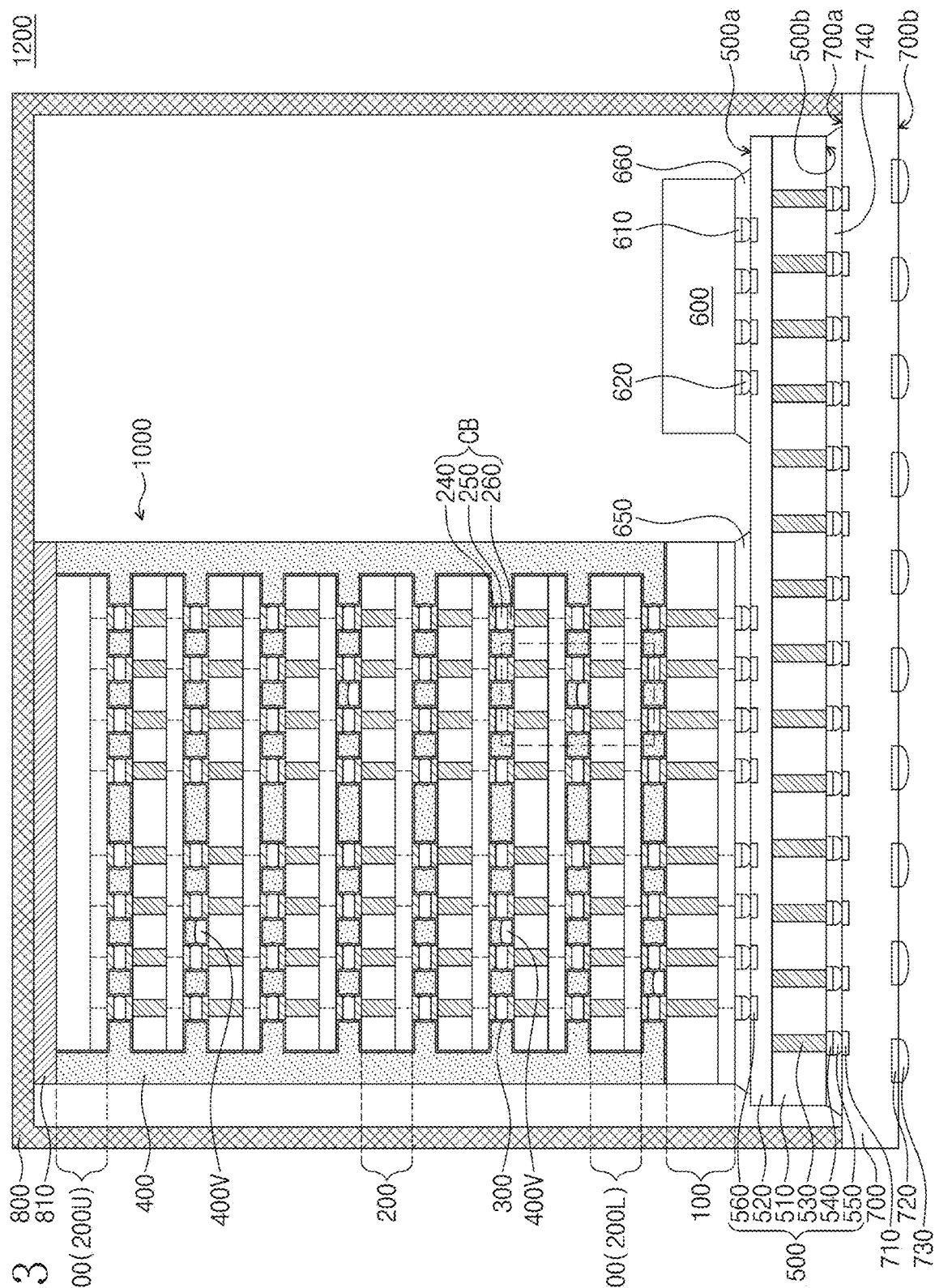
FIG. 13 illustrates a cross-sectional view showing a semiconductor package according to some example embodiments of the present inventive concepts.

FIG. 13 illustrates a cross-sectional view showing a semiconductor package according to some example embodiments of the present inventive concepts. The following semiconductor package is similar to that discussed with reference to FIGS. 1 to 8 and 12, and thus major differences between the semiconductor packages will be described below in the interest of brevity of description.

Referring to FIG. 13, a semiconductor package 1200 may further include a second substrate 700 and a thermal radiation structure 800 on the second substrate 700. The components of the semiconductor package discussed with reference to FIGS. 1 to 8 and 12 may be disposed on the second substrate 700 and inside the thermal radiation structure 800.

The second substrate 700 may include first lower substrate pads 710 adjacent to a first surface 700a thereof and second lower substrate pads 720 adjacent to a second surface 700b thereof. The first lower substrate pads 710 may be electrically connected to the second lower substrate pads 720 through internal lines provided in the second substrate 700. The first and second lower substrate pads 710 and 720 may include a conductive material (e.g., metal). Second bumps 730 may be disposed on the second surface 700b of the second substrate 700 and correspondingly connected to the second lower substrate pads 720. The second bumps 730 may include a conductive material and may have one of solder ball shapes, bump shapes, and pillar shapes. The second substrate 700 may be, for example, an integrated circuit board, a semiconductor chip, or a semiconductor package.

The first substrate 500 may be mounted on the first surface 700a of the second substrate 700. The first bumps 550 of the first substrate 500 may be connected to corresponding first lower substrate pads 710 of the second substrate 700. The first substrate 500 may be electrically connected to the second substrate 700 through the first bumps 550 and the first lower substrate pads 710.

A lower under-fill layer 740 may be disposed between the first substrate 500 and the second substrate 700, and may cover the first bumps 550. The lower under-fill layer 740 may include a dielectric polymer material, such as epoxy resin.

The thermal radiation structure 800 may be disposed on the first surface 700a of the second substrate 700, and may cover the components of one or more of the semiconductor packages 1000 and 1100 discussed with reference to FIGS. 1 to 8 and 12. The thermal radiation structure 800 may include a thermal conductive material. The thermal conductive material may include a metallic material (e.g., copper and/or aluminum) or a carbon-containing material (e.g., graphene, graphite, and/or carbon nano-tube). For example, the thermal radiation structure 800 may include a single metal layer or a plurality of stacked metal layers. For another example, the thermal radiation structure 800 may include a heat sink or a heat pipe. For another example, the thermal radiation structure 800 may be configured to use water cooling.

The semiconductor package 1200 may further include a thermal conductive layer 810 interposed between the unit chip package 1000 and the thermal radiation structure 800. The thermal conductive layer 810 may include a thermal interface material (TIM). The thermal interface material may include, for example, a polymer and thermal conductive particles. The thermal conductive particles may be dispersed in the polymer. Heat generated from the unit chip package 1000 may be transferred through the thermal conductive layer 810 to the thermal radiation structure 800.

According to the present inventive concepts, when at least one void is formed in a mold layer between a pair of neighboring connection bumps, a protection layer may be interposed between the mold layer and each of the pair of connection bumps, and may extend between the at least one void and each of the pair of connection bumps. Each of the pair of connection bumps may be spaced apart from the at least one void across the protection layer. Therefore, solder bumps of the pair of connection bumps may be prevented or mitigated from being extruded through the at least one void in a subsequent process, and as a result, it may be possible to prevent or mitigate an electrical short between the pair of connection bumps.

In addition, the mold layer includes a molded under-fill (MUF) material, and thus may serve as an under-fill layer between vertically stacked semiconductor chips, and may also serve as a molding compound that covers lateral surfaces of the semiconductor chips. Accordingly, it may be possible to simplify a method of fabricating a semiconductor package. Moreover, as the mold layer includes a molded under-fill (MUF) material, it may be possible to easily increase an amount of a thermal radiation material in the mold layer. Hence, a semiconductor package may improve in thermal radiation properties.

In conclusion, there may be provided a semiconductor package with increased electrical characteristics and improved thermal radiation properties and there also may be provided a simplified method of fabricating a semiconductor package.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A semiconductor package, comprising:
a lower semiconductor chip;
a plurality of semiconductor chips in a stack on the lower semiconductor chip in a first direction perpendicular to a top surface of the lower semiconductor chip;
a plurality of connection bumps between the lower semiconductor chip and a bottommost one of the plurality of semiconductor chips, and the plurality of connection bumps being between the plurality of semiconductor chips;
a protection layer that covers a lateral surface of each of the plurality of connection bumps; and
a mold layer on the lower semiconductor chip, the mold layer covering lateral surfaces of the plurality of semiconductor chips,
wherein the mold layer extends between the bottommost one of the plurality of semiconductor chips and the lower semiconductor chip, and the mold layer extends between the plurality of semiconductor chips,
wherein the protection layer is between the mold layer and the lateral surface of each of the plurality of connection bumps,
wherein each of the plurality of semiconductor chips has a top surface and a bottom surface that are opposite to each other in the first direction, and
the protection layer extends between the mold layer and the top surface of each of the plurality of semiconductor chips, and the protection layer extends between the mold layer and the bottom surface of each of the plurality of semiconductor chips.

2. The semiconductor package of claim 1, wherein the protection layer is in contact with the lateral surface of each of the plurality of connection bumps.

3. The semiconductor package of claim 2, wherein the protection layer is in contact with the mold layer.

4. The semiconductor package of claim 1, wherein the mold layer extends with no boundary from the lateral surfaces of the plurality of semiconductor chips toward a space between the bottommost one of the plurality of semiconductor chips and the lower semiconductor chip, and the mold layer extends between the plurality of semiconductor chips.

5. The semiconductor package of claim 1, wherein the mold layer defines at least one void between the bottommost one of the plurality of semiconductor chips and the lower semiconductor chip or between the plurality of semiconductor chips.

6. The semiconductor package of claim 1, wherein
the protection layer includes a self-assembled monolayer, the self-assembled monolayer includes a hydrocarbon chain, a first reaction group connected to one end of the hydrocarbon chain, and a second reaction group connected to an opposite end of the hydrocarbon chain, and
the first reaction group chemically adsorbs the self-assembled monolayer to the lateral surface of each of the plurality of connection bumps.

7. The semiconductor package of claim 6, wherein the second reaction group chemically adsorbs the self-assembled monolayer to a surface of the mold layer.

8. The semiconductor package of claim 6, wherein the protection layer further includes an organic dielectric layer between the self-assembled monolayer and the mold layer.

9. The semiconductor package of claim 1, wherein the protection layer includes an inorganic dielectric material.

10. A semiconductor package, comprising:
a lower semiconductor chip;
a plurality of semiconductor chips in a stack on the lower semiconductor chip in a first direction perpendicular to a top surface of the lower semiconductor chip;
a plurality of connection bumps between the lower semiconductor chip and a bottommost one of the plurality of semiconductor chips, and the plurality of connection bumps being between the plurality of semiconductor chips;
a protection layer that covers a lateral surface of each of the plurality of connection bumps;
a mold layer that covers lateral surfaces of the plurality of semiconductor chips and extends between the bottommost one of the plurality of semiconductor chips and the lower semiconductor chip, and the mold layer extends between the plurality of semiconductor chips; and
the mold layer including at least one void within the mold layer and between the bottommost one of the plurality of semiconductor chips and the lower semiconductor chip or between the plurality of semiconductor chips,
wherein the at least one void exposes at least a portion of the protection layer.

11. The semiconductor package of claim 10, wherein
the plurality of connection bumps include a pair of connection bumps that are spaced apart from each other across the at least one void, and
the protection layer is between the at least one void and each of the pair of connection bumps.

12. The semiconductor package of claim 10, wherein
each of the plurality of semiconductor chips has a top surface and a bottom surface that are opposite to each other in the first direction,
each of the plurality of connection bumps includes a conductive pillar, a solder bump, and a conductive pad that are sequentially stacked on the bottom surface of each of the plurality of semiconductor chips, and
the protection layer covers a lateral surface of the solder bump and extends onto a lateral surface of the conductive pillar and a lateral surface of the conductive pad.

13. The semiconductor package of claim 12, wherein
the conductive pillar is adjacent to the bottom surface of each of the plurality of semiconductor chips,
the conductive pad is adjacent to the top surface of the lower semiconductor chip or the top surface of a corresponding one of the plurality of semiconductor chips, and
the solder bump is between the conductive pillar and the conductive pad.

14. The semiconductor package of claim 10, wherein
each of the plurality of semiconductor chips has a top surface and a bottom surface that are opposite to each other in the first direction, and the protection layer extends between the mold layer and the bottom surface of each of the plurality of semiconductor chips, and the protection layer extends between the mold layer and the top surface of each of the plurality of semiconductor chips.

\* \* \* \* \*